US009425825B2

(12) United States Patent
Bauchot et al.

(10) Patent No.: US 9,425,825 B2
(45) Date of Patent: Aug. 23, 2016

(54) PATH ENCODING AND DECODING

(71) Applicant: International Business Machines Corporation, Armonk, NY (US)

(72) Inventors: Frederic J. Bauchot, Saint-Jeannet (FR); Marc Joel Herve Legroux, de Strasbourg Angers (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/947,101

(22) Filed: Nov. 20, 2015

(65) Prior Publication Data
US 2016/0182085 A1    Jun. 23, 2016

(51) Int. Cl.
*H03M 7/00* (2006.01)
*H03M 9/00* (2006.01)
*H03M 7/14* (2006.01)
*G06F 17/22* (2006.01)
(Continued)

(52) U.S. Cl.
CPC .............. *H03M 9/00* (2013.01); *G06F 17/2217* (2013.01); *H03M 7/14* (2013.01); *H03M 5/00* (2013.01); *H03M 7/30* (2013.01); *H03M 7/40* (2013.01); *H03M 7/4025* (2013.01)

(58) Field of Classification Search
CPC ....... H03M 5/00; H03M 7/40; H03M 7/4025; H03M 7/30
USPC .......................................... 341/90, 65, 50, 66
See application file for complete search history.

(56) References Cited

U.S. PATENT DOCUMENTS 4,555,805 A    11/1985    Talbot
4,602,283 A     7/1986    Corgnier et al.
(Continued)

FOREIGN PATENT DOCUMENTS

CN    102025482 A    4/2011
CN    103023653 A    4/2013
(Continued)

OTHER PUBLICATIONS

Computer Security CS 426 Lecture 3, "Cryptography: One time Pad, Information Theoretical Security, and Stream Clphers," Fall 2010, 19 pages, CS426, URL:https://www.cs.purdue.edu/homes/ninghui/courses/426_Fall10/_lect03.pdf.
(Continued)

*Primary Examiner* — Joseph Lauture
(74) *Attorney, Agent, or Firm* — Dan Simek; Hoffman Warnick LLC

(57) ABSTRACT

This invention relates to a system, method and computer program product for encoding an input string of binary characters including: a cellular data structure definition including a starting empty cell; one or more path definitions defining paths through the data structure; a character reading and writing engine for writing a binary character to an empty cell with a predefined initial position; a next cell determination engine for determining a next empty cell by methodically checking cells along one of the paths in the data structure until an empty cell is located; a loop facilitator for looping back to the writing next character step and the determining next cell step until there are no more data characters or a next empty cell is not determined; and a serialization deserialization engine for methodically serializing the data structure into a one dimensional binary string of characters representing an encoded string of alphanumeric characters.

19 Claims, 17 Drawing Sheets

(51) Int. Cl.
  *H03M 7/30* (2006.01)
  *H03M 5/00* (2006.01)
  *H03M 7/40* (2006.01)

(56) References Cited

U.S. PATENT DOCUMENTS

| | | | |
|---|---|---|---|
| 6,014,733 | A | 1/2000 | Bennett |
| 6,737,994 | B2 * | 5/2004 | Davis .................... H03M 7/30 341/50 |
| 6,876,774 | B2 | 4/2005 | Satoh et al. |
| 7,327,293 | B2 | 2/2008 | Foster |
| 8,311,222 | B2 | 11/2012 | Rawson, Sr. |
| 8,340,162 | B2 | 12/2012 | Tzannes |
| 8,467,533 | B2 | 6/2013 | Hammersmith |
| 8,670,560 | B2 | 3/2014 | Cheddad et al. |
| 8,687,810 | B2 | 4/2014 | Bukshpun et al. |
| 9,350,382 | B1 | 5/2016 | Bauchot et al. |
| 2003/0118186 | A1 | 6/2003 | Gilley |
| 2009/0063431 | A1 | 3/2009 | Erol et al. |
| 2009/0100048 | A1 | 4/2009 | Hull et al. |
| 2010/0281256 | A1 | 11/2010 | Farrugia et al. |
| 2012/0011360 | A1 | 1/2012 | Engels et al. |
| 2012/0082310 | A1 | 4/2012 | Rashkovskiy et al. |
| 2013/0232305 | A1 | 9/2013 | Cuthbert, II et al. |
| 2014/0105382 | A1 | 4/2014 | Liu |

FOREIGN PATENT DOCUMENTS

| | | |
|---|---|---|
| CN | 103684742 A | 3/2014 |
| EP | 0089632 A1 | 9/1983 |
| EP | 0304217 A2 | 2/1989 |
| EP | 0445290 B1 | 3/1997 |
| GB | 1295572 | 11/1972 |
| WO | 2010046104 A2 | 4/2010 |
| WO | 2014082090 A1 | 5/2014 |

OTHER PUBLICATIONS

Great Britain Intellectual Property Office, Search Report under Section 17(5), for Application No. GB1422719.3 completed Jul. 3, 2015, (IBMC-0482), 3 pages.
Great Britain Intellectual Property Office, Search Report under Section 17(5), for Application No. GB1422717.7 completed Jul. 3, 2015, (IBMC-0482), 3 pages.
Great Britain Intellectual Property Office, Search Report under Section 17(5), for Application No. GB1422717.4 completed Jul. 19, 2015, (IBMC-0484), 4 pages.
Bhattasali, "LICRYPT: Lightweight Cryptography Technique for Securing Smart Objects in Internet of Things Environment," May 2013, 3 pages, CSI Communications, www.csi-india.org.
Internet Archive WaybackMachine, rick's blog, "Stream Clipers," Jun. 2007, 8 pages, Cryptosmith, Security, Tech Teaching, http://cryptosmith.com/2007/06/07/stream-ciphers/.
Wikipedia, the free encyclopedia, "One-time pad," retrieved from https://en.wikipedia.org/wiki/one-time_pad/, Aug. 2015, 6 pages.
Wikipedia, the free encyclopedia, "Sinc filter," retrieved from https://en.wikipedia.org/wiki/Sinc_filter/, Aug. 2015, 2 pages.
Nguyen, Notice of Allowance and Fee(s) Due for U.S. Appl. No. 14/947,068 dated Mar. 3, 2016, 13 pages.
U.S. Appl. No. 15/086,246 Office Action 1 dated Jun. 3, 2016, 18 pages.

* cited by examiner

Path Encoding and Decoding Module 200

Cellular Space Definition Data 202

Path Definition Data 203

Character Reading and Writing Engine 204

Next Cell Determination Engine 206

Loop Facilitator 208

Serialization De-serialization Engine 210

Path Encoding Method 300

Path Decoding Method 400

FIGURE 2

|   | 1 | 2 | 3 | 4 | 5 | 6 | 7 | 8 |
|---|---|---|---|---|---|---|---|---|
| A | 15 | 16 | 17 | 18 | 19 | 20 | 21 | 22 |
| B | 14 | 29 | 28 | 27 | 26 | 25 | 24 | 23 |
| C | 13 | 30 | 31 | 32 | 33 | 34 | 39 | 40 |
| D | 12 | 3 | 2 | 1 | 64 | 35 | 38 | 41 |
| E | 11 | 4 | 61 | 62 | 63 | 36 | 37 | 42 |
| F | 10 | 5 | 60 | 59 | 58 | 57 | 56 | 43 |
| G | 9 | 6 | 51 | 52 | 53 | 54 | 55 | 44 |
| H | 8 | 7 | 50 | 49 | 48 | 47 | 46 | 45 |

FIGURE 5A

| Raw stream | 0000 0001 0001 0110 1111 0110 1111 0001 0011 1001 0111 1011 1010 0000 1101 0101 |
|---|---|
| Unencoded Data | 0116F6F1397BA0C5 |
| Coded Stream | 1010 0110 1110 1100 1010 0001 0010 0000 0101 0011 1101 1000 1001 0111 1011 0111 |
| Coded Data | A6ECA12053D897B7 |

FIGURE 5B

Parameters:
Initial Position (IP)=28; jump(00)=1; jump(01)=2; jump(10)=3; jump(11)=4; Matrix Width (MW)=8; Matrix Height (MH)=8; String Size (SS)=64; Or=-1

| Raw stream | 0000 0001 0001 0110 1111 0110 1111 0001 0011 1001 0111 1011 1010 0000 1101 0101 |
|---|---|
| coded stream | 1010 1000 1110 1010 1100 0110 0100 0101 0100 1111 1000 1000 0010 1111 1011 0110 |

FIGURE 6A

| Raw stream | 0116F6F1397BA0C5 |
|---|---|
| coded stream | 8EAC6454F882FB6 |

FIGURE 6B

Parameters:
Initial Position (IP)=28; jump(00)=3; jump(01)=4; jump(10)=5; jump(11)=6; Matrix Width (MW)=8; Matrix Height (MH)=8; String Size (SS)=64; Or=-1; Initial Path (DP)=A

FIGURE 6C

FILLING ORDER

| 44 | 7  | 8  | 55 | 49 | 50 | 59 | 9  |
|----|----|----|----|----|----|----|----|
| 43 | 37 | 12 | 11 | 45 | 61 | 60 | 10 |
| 64 | 25 | 38 | 46 | 13 | 14 | 15 | 16 |
| 6  | 26 | 2  | 1  | 56 | 27 | 52 | 51 |
| 5  | 36 | 34 | 21 | 22 | 28 | 57 | 58 |
| 35 | 63 | 33 | 54 | 42 | 41 | 53 | 39 |
| 24 | 3  | 48 | 31 | 32 | 19 | 20 | 40 |
| 23 | 4  | 47 | 62 | 30 | 18 | 17 | 29 |

PATH ENCODING AND DECODING

FIELD OF THE INVENTION

This invention relates to a method and apparatus for encoding and decoding data. In particular the invention relates to a method and apparatus for encoding and decoding data using a path through a data structure made up of cells.

BACKGROUND

The trend for encoding and decoding text is to use ever more complex algorithms. To this extent, increasing processing power is required to encode and decode. The logical consequence of this is to use dedicated hardware components, but this still uses stringent computer resources (memory, computer processing cycles) and more powerful energy sources.

Mobile devices often have more constrained resource than a desktop counterpart but often mobile applications only need a low level of encoding. For instance, field sensors and actuators would benefit from a system which presents a good trade-off between: reduced power consumption; computer resource; and security strength.

SUMMARY OF INVENTION

In a first aspect of the invention there is provided a system for encoding an input string of binary characters comprising: a cellular data structure definition including a starting empty cell; one or more path definitions defining paths through the data structure; a character reading and writing engine for writing a binary character to an empty cell with a predefined initial position; a next cell determination engine for determining a next empty cell by methodically checking cells along one of the paths in the data structure until an empty cell is located; a loop facilitator for looping back to the writing next character step and the determining next cell step until there are no more data characters or a next empty cell is not determined; and a serialization deserialization engine for methodically serializing the data structure into a one dimensional binary string of characters representing an encoded string of alphanumeric characters.

In another aspect of the invention there is provided a method of encoding an input string of binary characters comprising: defining a cellular data structure including a starting empty cell; defining one or more paths through the data structure; writing a binary character to an empty cell with a predefined initial position; determining a next empty cell by methodically checking cells along one of the paths in the data structure until an empty cell is located; looping back to the writing next character step and the determining next cell step until there are no more data characters or a next empty cell is not determined; and methodically serializing the data structure into a one dimensional binary string of characters representing an encoded string of alphanumeric characters.

According to another aspect of the invention there is provided a method of decoding an input string of binary characters representing an encoded string of alphanumeric characters comprising: defining a cellular data structure including a starting current cell; defining one or more paths through the data structure; populating the cells with the binary characters using a defined transform so that each populated cell is full; reading a binary character from the current cell; writing it to an output string, and setting the current cell to empty; determining a next full cell by methodically traversing from the current cell to adjacent cells along the one or more paths in the data structure until a full cell is located; looping back to the reading next character step and the determining next cell step until there are no more cells in the data structure or a next full cell is not determined; and presenting the output string as a decoded string of alphanumeric characters.

In another aspect of the invention there is provided a computer program product comprising a computer-readable storage medium having computer-readable program code embodied therewith, the computer-readable program code configured to perform a method for encoding an input string of binary characters representing alphanumeric characters when executed by a computer system, the method comprising: defining a cellular data structure including a starting empty cell; defining one or more paths through the data structure; writing a binary character to an empty cell with a predefined initial position; determining a next empty cell by methodically checking cells along one of the paths in the data structure until an empty cell is located; looping back to the writing next character step and the determining next cell step until there are no more data characters or a next empty cell is not determined; and methodically serializing the data structure into a one dimensional binary string of characters representing an encoded string of alphanumeric characters.

BRIEF DESCRIPTION OF THE DRAWINGS

Embodiments of the present invention will now be described, by way of example only, with reference to the following drawings.

FIG. 2 is a component diagram according to an embodiment.

FIG. 5A is an example diagram of path in a matrix.

FIG. 5B is an example raw stream characters and coded stream characters.

FIG. 5C is an example diagram of initial parameters used to code the example of FIG. 5B.

FIGS. 5D, 5E and 5F are state diagrams of an example pad as it is used to code the raw stream to the coded stream of FIG. 5B.

FIG. 6A is another example of not yet encoded raw binary stream with corresponding coded binary stream.

FIG. 6B is a hexadecimal representation of the raw stream and coded stream of 6A.

FIG. 6C is a list of the parameters used for the coding example of 6A.

FIG. 6F is a table showing the order of filling a matrix.

FIGS. 6G, 6H, 6I and 6J are state diagrams of an example pad as it is used to code the raw stream to the coded stream of FIG. 6B.

DETAILED DESCRIPTION

Figure 1:
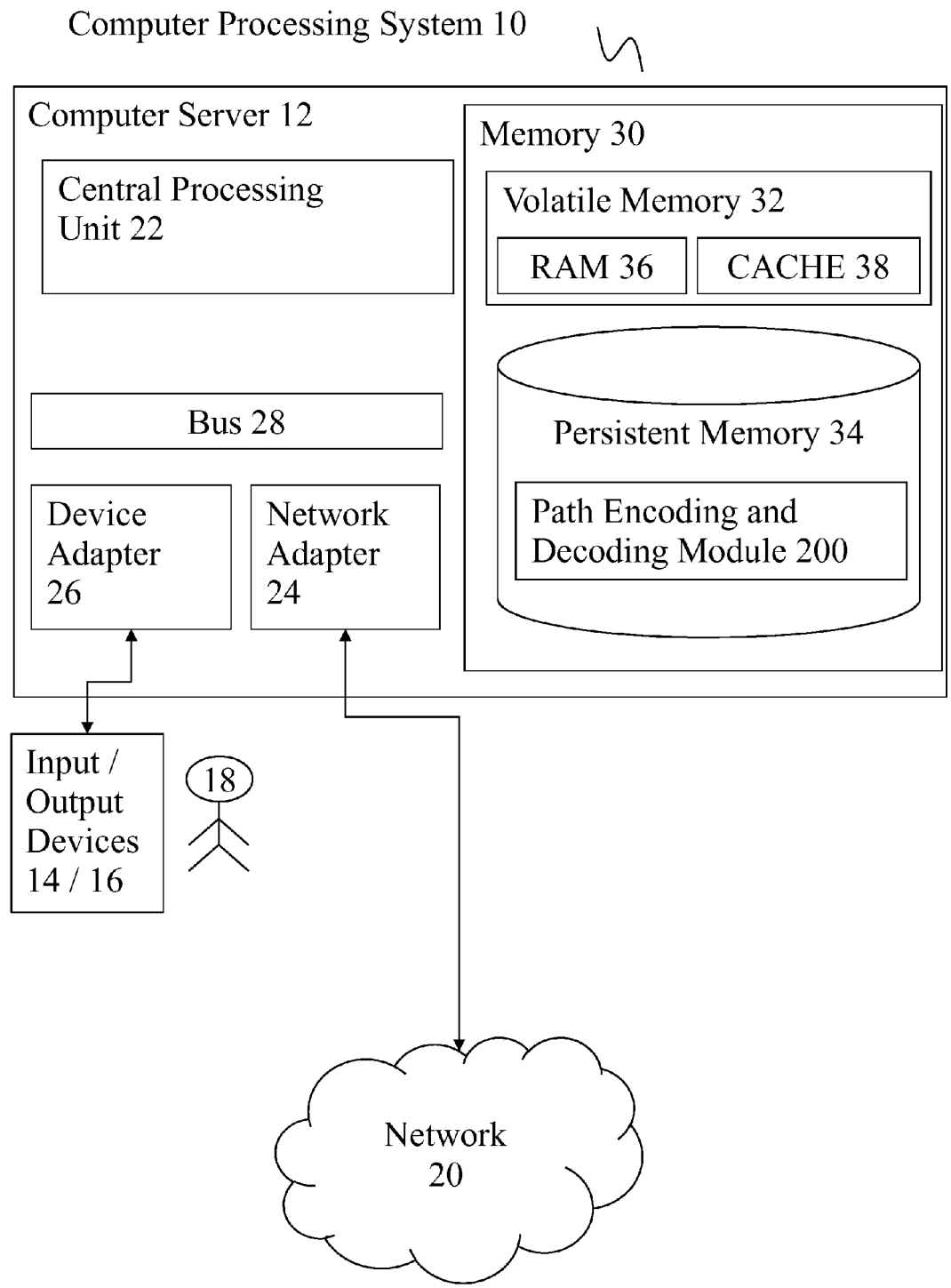
FIG. 1 is a deployment diagram according to an embodiment.

Referring to FIG. 1, the deployment of n embodiment in computer processing system 10 is described. Computer processing system 10 is operational with numerous other general purpose or special purpose computing system environments or configurations. Examples of well-known computing processing systems, environments, and/or configurations that may be suitable for use with computer processing system 10 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices.

Computer processing system 10 may be described in the general context of computer system-executable instructions, such as program modules, being executed by a computer processor. Generally, program modules may include routines, programs, objects, components, logic, and data structures that perform particular tasks or implement particular abstract data types. Computer processing system 10 may be embodied in distributed cloud computing environments where tasks are performed by remote processing devices that are linked through a communications network. In a distributed cloud computing environment, program modules may be located in both local and remote computer system storage media including memory storage devices.

Computer processing system 10 comprises: general-purpose computer server 12 and one or more input devices 14 and output devices 16 directly attached to the computer server 12. Computer processing system 10 is connected to a network 20. Computer processing system 10 communicates with a user 18 using input devices 14 and output devices 16. Input devices 14 include one or more of: a keyboard, a scanner, a mouse, trackball or another pointing device. Output devices 16 include one or more of a display or a printer. Computer processing system 10 communicates with network devices (not shown) over network 20. Network 20 can be a local area network (LAN), a wide area network (WAN), or the Internet.

Computer server 12 comprises: central processing unit (CPU) 22; network adapter 24; device adapter 26; bus 28 and memory 30.

CPU 22 loads machine instructions from memory 30 and performs machine operations in response to the instructions. Such machine operations include: incrementing or decrementing a value in a register; transferring a value from memory 30 to a register or vice versa; branching to a different location in memory if a condition is true or false (also known as a conditional branch instruction); and adding or subtracting the values in two different registers and loading the result in another register. A typical CPU can perform many different machine operations. A set of machine instructions is called a machine code program, the machine instructions are written in a machine code language which is referred to a low level language. A computer program written in a high level language needs to be compiled to a machine code program before it can be run. Alternatively a machine code program such as a virtual machine or an interpreter can interpret a high level language in terms of machine operations.

Network adapter 24 is connected to bus 28 and network 20 for enabling communication between the computer server 12 and network devices.

Device adapter 26 is connected to bus 28 and input devices 14 and output devices 16 for enabling communication between computer server 12 and input devices 14 and output devices 16.

Bus 28 couples the main system components together including memory 30 to CPU 22. Bus 28 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Memory 30 includes computer system readable media in the form of volatile memory 32 and non-volatile or persistent memory 34 which may include, in one embodiment, read-only (ROM). Examples of volatile memory 32 are random access memory (RAM) 36 and cache memory 38. Generally volatile memory is used because it is faster and generally non-volatile memory is used because it will hold the data for longer. Computer processing system 10 may further include other removable and/or non-removable, volatile and/or non-volatile computer system storage media. By way of example only, persistent memory 34 can be provided for reading from and writing to a non-removable, non-volatile magnetic media (not shown and typically a magnetic hard disk or solid-state drive). Although not shown, further storage media may be provided including: an external port for removable, non-volatile solid-state memory; and an optical disk drive for reading from or writing to a removable, non-volatile optical disk such as a compact disk (CD), digital video disk (DVD) or Blu-ray. In such instances, each can be connected to bus 28 by one or more data media interfaces. As will be further depicted and described below, memory 30 may include at least one program product having a set (for example, at least one) of program modules that are configured to carry out the functions of embodiments of the invention.

The set of program modules configured to carry out the functions of the embodiment comprises encoding and decoding module 200. In one embodiment, ROM in the memory 30 stores module 200 that enables the computer server 12 to function as a special purpose computer specific to the module 200. Further program modules that support the embodiment but are not shown include firmware, boot strap program, operating system, and support applications. Each of the operating system, support applications, other program modules, and program data or some combination thereof, may include an implementation of a networking environment.

Computer processing system 10 communicates with at least one network 20 (such as a local area network (LAN), a general wide area network (WAN), and/or a public network like the Internet) via network adapter 24. Network adapter 24 communicates with the other components of computer server 12 via bus 28. It should be understood that although not shown, other hardware and/or software components could be used in conjunction with computer processing system 10. Examples, include, but are not limited to: microcode, device drivers, redundant processing units, external disk drive arrays, redundant array of independent disks (RAID), tape drives, and data archival storage systems.

Referring to FIG. 2, encoding and decoding module 200 comprises the following components: cellular space definition data register 202; path definition data register 203; character reading and writing engine 204; next cell determination engine 206; loop facilitator 208; serialization deserialization engine 210; encoding method 300 and decoding method 400.

The Cellular space definition data register 202 is for storing cellular space definition data used for defining the cellular data structure for the encoding and decoding method. In the example the cellular data structure is a two dimension orthogonal matrix but other dimensions and coordinate systems can be used.

Path definition data register 203 is for storing the definition for the paths in the data structure. For instance, a path can be defined by a list of coordinates in the data structure and in the present example of the 8 by 8 matrix in FIG. 5A the paths can be defined using chessboard notation A1 to H8 such that starting at A1, a path starting at the 15$^{th}$ cell is defined by the list A1, A2, A3, A4, A5, A6, A7, A8, B8, B7, B6, B5, B4, B3, B2, C2, C3, C4, C5, C6, D6, E6, E7, D7, C7, C8, D8, E8, F8, G8, H8 and so on.

Character reading and writing engine 204 is for reading characters from and writing characters to the cellular space.

Next cell determination engine 206 is for determining the next cell in the cellular space.

Loop facilitator 208 is for looping between the character reading and writing engine 204 and the next cell determination engine 206.

Serialization deserialization engine 210 is for serializing and de-serializing the two dimensional shape into and from serial data.

Encoding method 300 controls the main coding process.

Decoding method 400 controls the main decoding process.

Figure 3A:
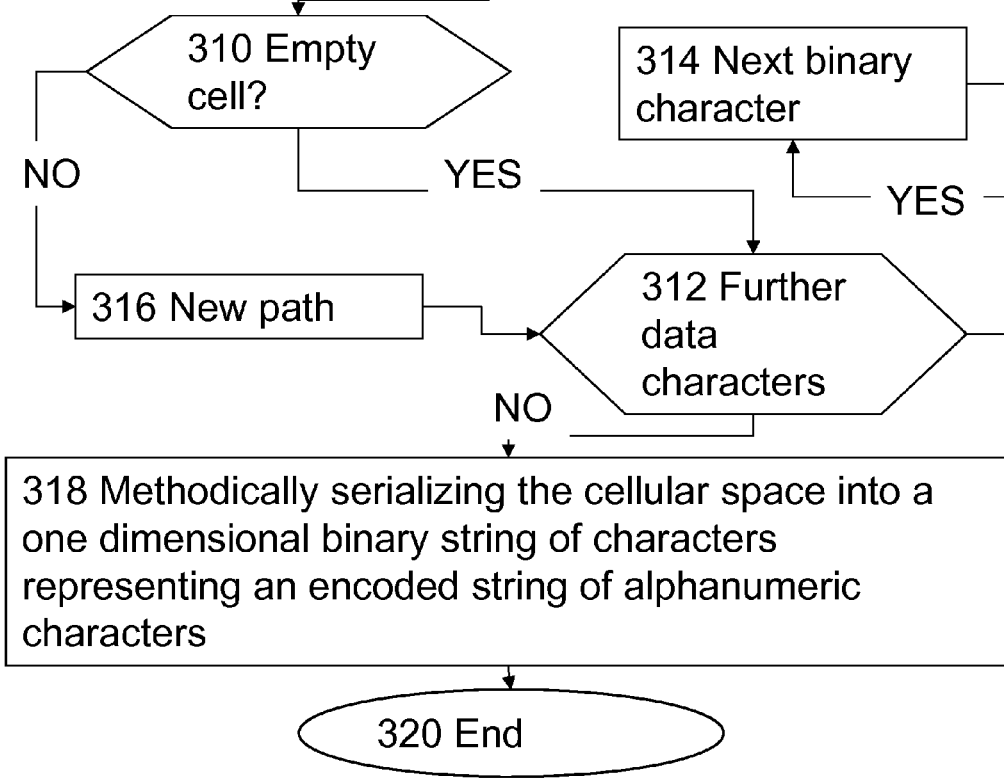
FIG. 3A is a flow diagram of a process of the encoding method according to an embodiment.
Figure 3B:
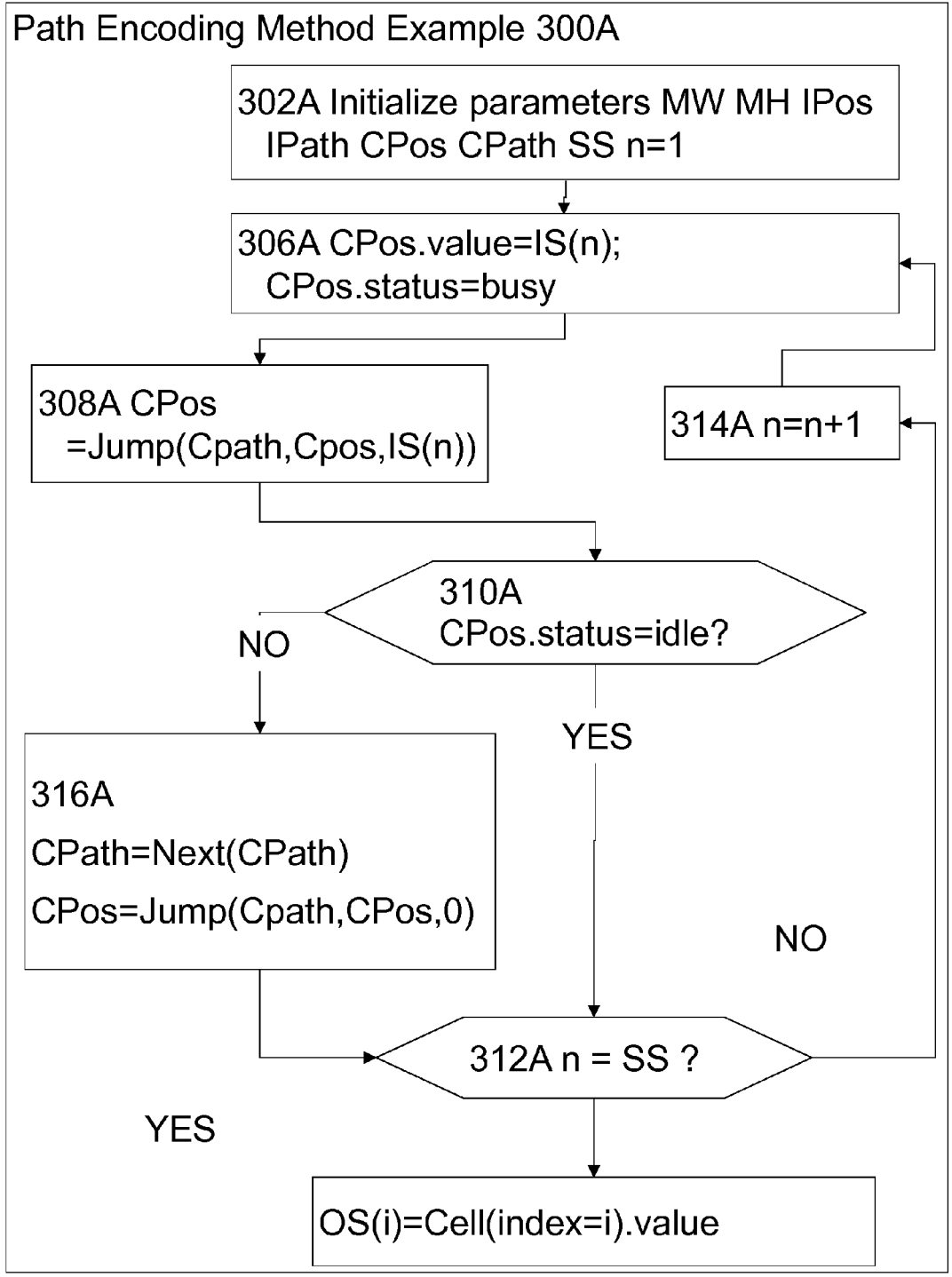
FIG. 3B is a flow diagram of an example process of the encoding method according to an embodiment.

Referring to FIG. 3A, method 300 comprises logical process steps 302 to 320 of the embodiment with corresponding example logical process steps 302A to 320A describing an example of the embodiment with respect to FIG. 3B. Method 300 starts when a user selects some text or data and then selects that encoding method 300 be executed on the selected text.

Step 302 is for defining a cellular data structure including a starting empty cell. For example a matrix data structure would be defined by the following parameters: matrix width (MW); matrix height (MH); initial position (IPos); initial path (IPath); current position (CPos); current path (CPath); and string size (SS). Initial position and initial path are set to n=1 but can be set to any possible value of n. Each position of the matrix is identified with an index in an index table. The matrix is filled bit by bit, following the sequence of input bits, starting with an initial position (IPos) and an initial path (IPath).

Step 304 is for defining one or more paths through the data structure. In the example of FIG. 5A to 5E only one path is shown.

Step 306 is for writing a binary character to an empty cell with a predefined initial position. For example, at each step, the nth input bit IS(n) is written in the nth current position (CPos) along a current path (CPath). This is illustrated by step 306A where the value of CPos is set to IS(n) as in the formula CPos.value=IS(n). At the beginning of the process, all positions have a status 'idle' and are turned 'busy' once they are filled by an input bit. This is illustrated by step 306A where the status of the current position is set to busy as in the formula CPos.status=busy.

Figure 5D:
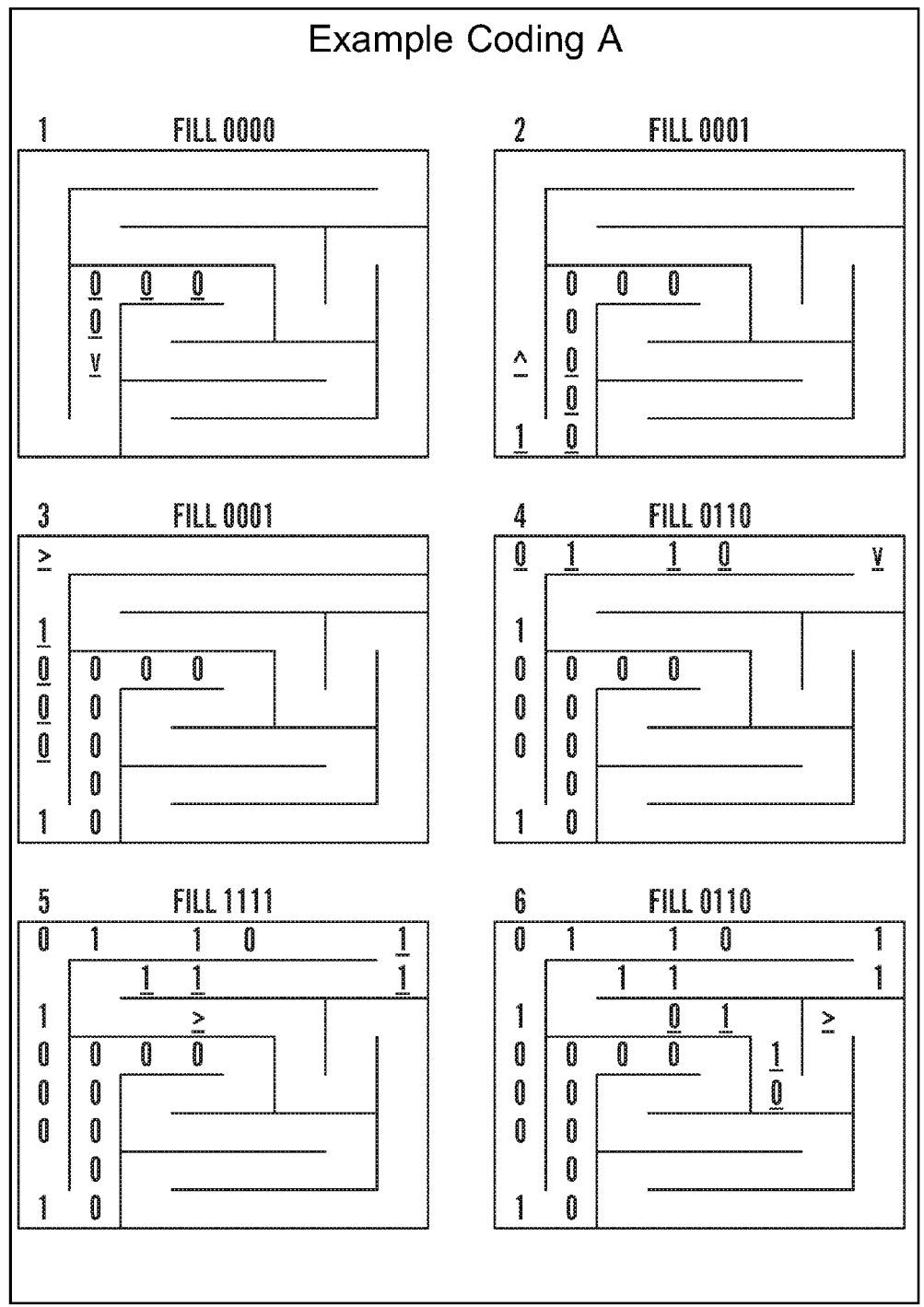

Step 308 is for determining a next cell by methodically checking cells along the paths in the data structure until a cell is located. In an embodiment the next cell is determined as a function of the current path, current position and the binary characters written. For example, after filling the current position (CPos) with the bit from the input string IS(n), then the next current position is determined by first jumping over the next busy positions along the current path and then jumping zero, one or more idle cells. If CPos is not idle then the next path in a path list becomes the current path and CPos is the next idle cell. This is illustrated by step 308A with the formula CPos=Jump(Cpath,Cpos,IS(n)). An example of different jumps is shown in the example of FIGS. 5B, 5C and 5D. If binary characters 00 are written then one idle cell is jumped over (jump(00)=1). If binary characters 01 are written then two idle cells are jumped over (jump(01)=2). If binary characters 10 are written then three idle cells are jumped over (jump(10)=3). If binary characters 11 are written then four idle cells are subsequently jumped (jump(11)=4).

Step 310 is for determining if the next cell is idle and branching to step 312 if so. If the cell is not idle then the process branches to step 316. This is illustrated in step 310A where the status of the current position compared to an idle status with the formula CPos.status=idle?

Step 312 is for branching to step 314 if there are further data characters to process. If there are no more data characters then the process branches to step 318. This is illustrated with step 312A where the input string counter (n) is compared to the string size (SS) using the formula n=SS?

Step 314 is for incrementing the input string counter (n) to the next binary character and looping back to step 306 where the writing (step 306) and determining (step 308) are performed with respect to the next binary character and new current position. This is illustrated with step 314A and the formula n=n+1.

Step 316 is for switching to a new path. If there is one only path then no switch is made. If there are two paths then this step alternates between them. Furthermore a new current possible is located after the busy cells but using the new path. Next step 312. This is illustrated by step 316A where the current path is incremented the next current path using the formula CPath=Next (CPath). Furthermore the current position is updated by jumping to the end of the busy cells and no further as illustrated by zero in the formula CPos=Jump (CPath, CPos,0).

Step 318 is for methodically serializing the data structure into a one dimensional binary string of characters representing an encoded string of alphanumeric characters. This may be performed simply using left to right and top to bottom or by using a further path through the data structure.

Step 320 is the end of the method.

Figure 4A:
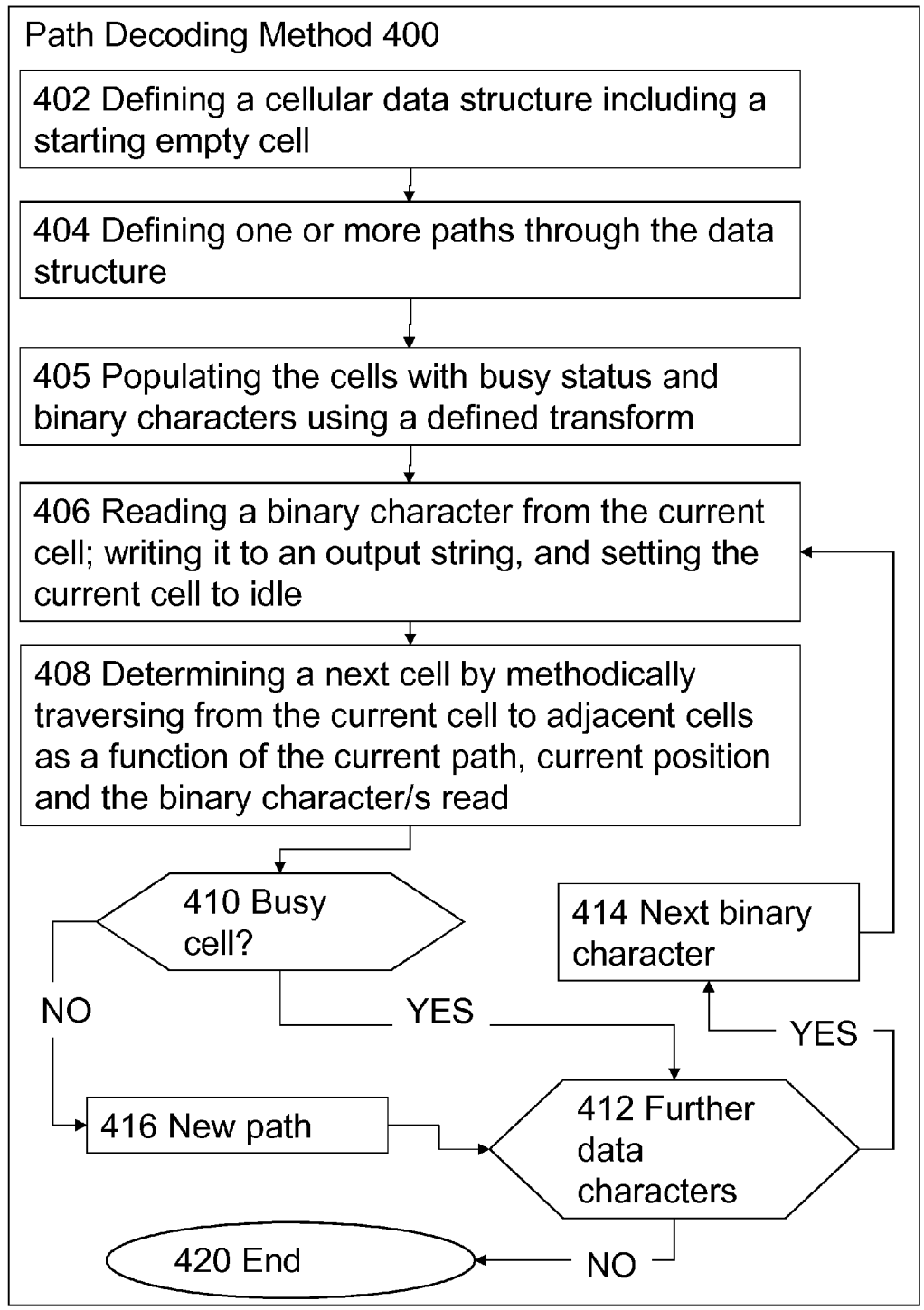
FIG. 4A is a flow diagrams of a process of the decoding method according to an embodiment.
Figure 4B:
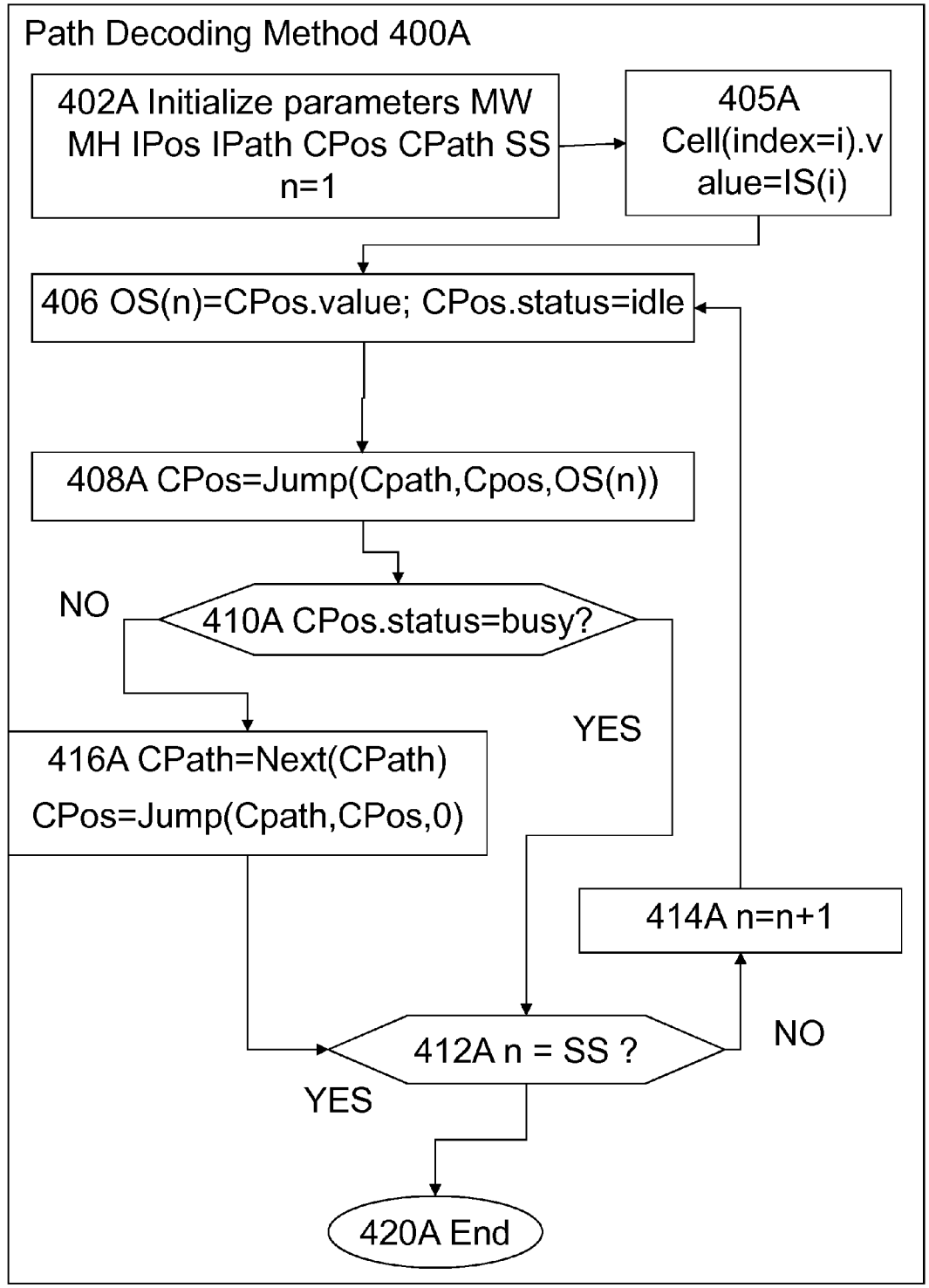
FIG. 4B is a flow diagrams of a process of the decoding method according to an embodiment.

Referring to FIG. 4A, method 400 comprises logical process steps 402 to 420 of the embodiment with corresponding example logical process steps 402A to 420A describing an example of the embodiment with respect to FIG. 4B. Method 400 starts when a user selects some encoded text in an input string and then selects that decoding method 400 be executed on the selected text to produce a decoded output string.

Step 402 is for defining a cellular data structure including a starting empty cell. For example a matrix data structure would be defined by parameters as shown in example 420A: matrix width (MW); matrix height (MH); initial position (IPos); initial path (IPath); current position (CPos); current path (CPath); and string size (SS). Initial position and initial path are set to n=1 but can be set to any possible value of n. Each position of the matrix is identified with an index in an index table. The matrix is filled bit by bit, following the sequence of input bits, starting with an initial position (IPos) and an initial path (IPath).

Step 404 is for defining one or more paths through the data structure. In the example of FIG. 5A to 5E only one path is shown.

Step 405 is for filling the data structure from the one dimensional binary string of characters of the input string representing an encoded string of alphanumeric characters. This may be performed simply using left to right and top to bottom or by using a further path through the data structure. It is important that filling method used is the logical opposite of the deserialization method of step 318. This is illustrated in step 405A by setting a cell indexed by i to a value equal to the input string indexed by I according to the formula cell(index=i).value= IS(i).

Step 406 is for reading a binary character from a cell with a predefined initial position. For example, at each step, the nth output string bit is read from the nth current position (CPos) along a current path (CPath). This is illustrated by step 406A where the value of CPos is set to IS(n) as in the formula CPos.value=IS(n). At the beginning of the process, all positions have a status 'idle' and are turned 'busy' once they are filled by an input bit.

Step 408 is for determining a next cell as a function of the current path, current position and the binary characters written. For example, after filling the output string OS(n) with a but from the current position (CPos), then the next current position is determined by first jumping over the immediate idle positions along the current path to the next busy cell and then jumping zero, one or more cells depending on the output bits. This is illustrated by step 408A with the formula CPos=Jump(Cpath,Cpos,OS(n)). An example of different jumps is shown in the example of FIGS. 5B, 5C and 5D. If binary characters 00 are written then one idle cell is jumped over (jump(00)=1). If binary characters 01 are written then two idle cells are jumped over (jump(01)=2). If binary characters 10 are written then three idle cells are jumped over (jump(10)=3). If binary characters 11 are written then four idle cells are subsequently jumped (jump(11)=4).

Step 410 is for determining if the next cell is busy and branching to step 412 if so. If the cell is not busy then the process branches to step 416. This is illustrated in step 410A where the status of the current position compared to a busy status with the formula CPos.status=busy?

Step 412 is for branching to step 414 if there are further data characters to process. If there are no more data characters then the process branches to step 420. This is illustrated with step 412A where the output string counter (n) is compared to the string size (SS) using the formula n=SS?

Step 414 is for incrementing the output string counter (n) to the next binary character and looping back to step 406 where the reading (step 406) and determining (step 408) are performed with respect to the next binary character and new current position. This is illustrated with step 414A and the formula n=n+1.

Step 416 is for switching to a new path. If there is one only path then no switch is made. If there are two paths then this step alternates between them. Furthermore a new current possible is located after the busy cells but using the new path. Next step 412. This is illustrated by step 416A where the current path is set to the next current path using the formula CPath=Next (CPath). Furthermore the current position is updated by jumping to the end of the idle cells and no further as illustrated by zero in the formula CPos=Jump(CPath, CPos,0).

Step 420 is the end of the method.

Referring to FIG. 5A, an example matrix is shown having an example path starting (1) at position D4 moving initially (2) to D3, following a path shown by ascending.

Referring to FIG. 5B, an example of a raw stream and a coded stream. The raw stream is a sequence of binary numbers "0000 0001 0001 0110 1111 0110 1111 0001 0011 1001 0111 1011 1010 0000 1101 0101" that represent the hexadecimal numbers "0116F6F1397BA0C5". The final coded stream is "1010 0110 1110 1100 1010 0001 0010 0000 0101 0011 1101 1000 1001 1011 1011 0111" representing the hexadecimal numbers "A6ECA12053D897B7".

FIG. 5C is an example set of initial parameters used to code the example of FIG. 5B. Initial Position (IP)=1; Initial Direction (ID)=East; TD=East; ED=East; Pad Width (PW)=8; Pad Height (PH)=8; and String Size (SS)=64.

Figure 5E:
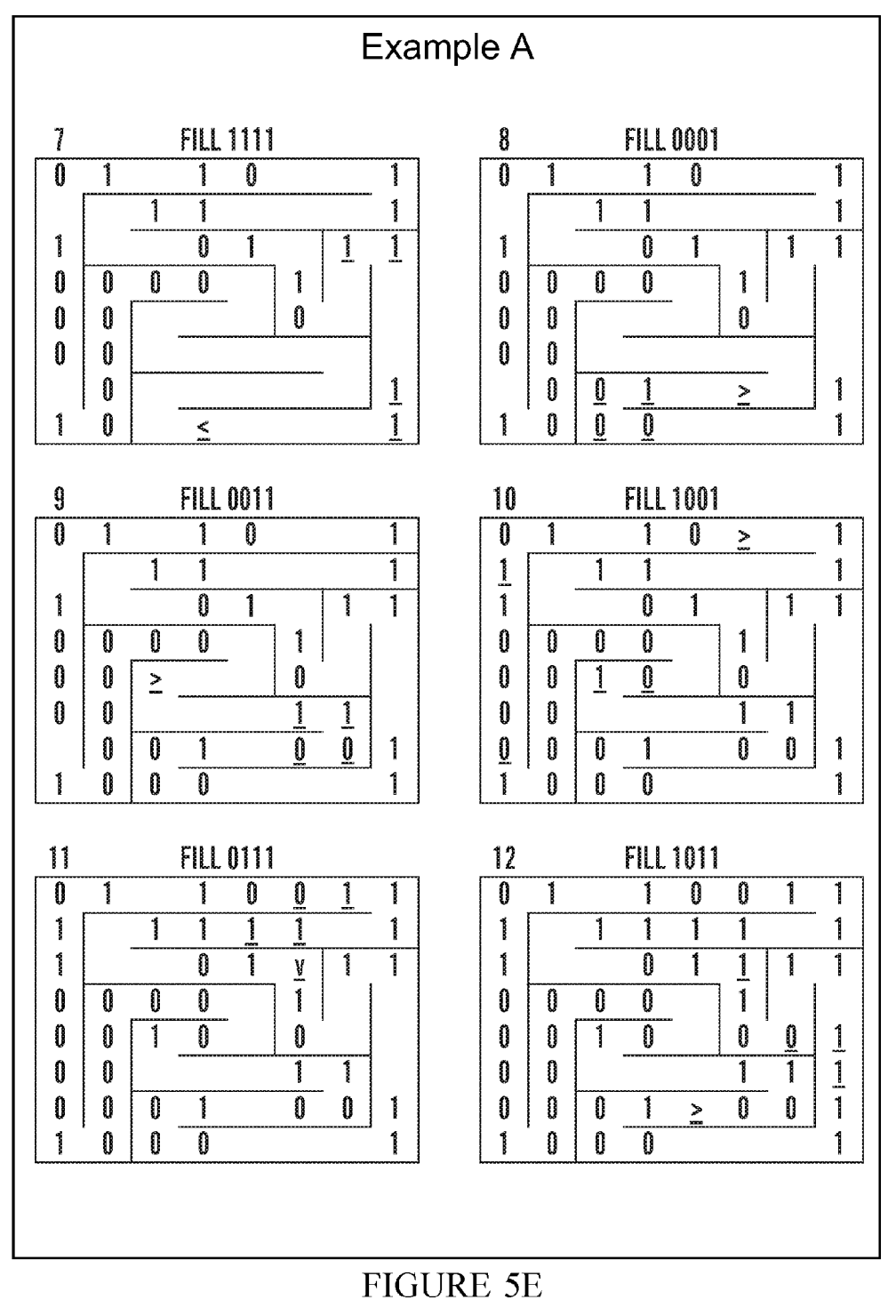
Figure 5F:
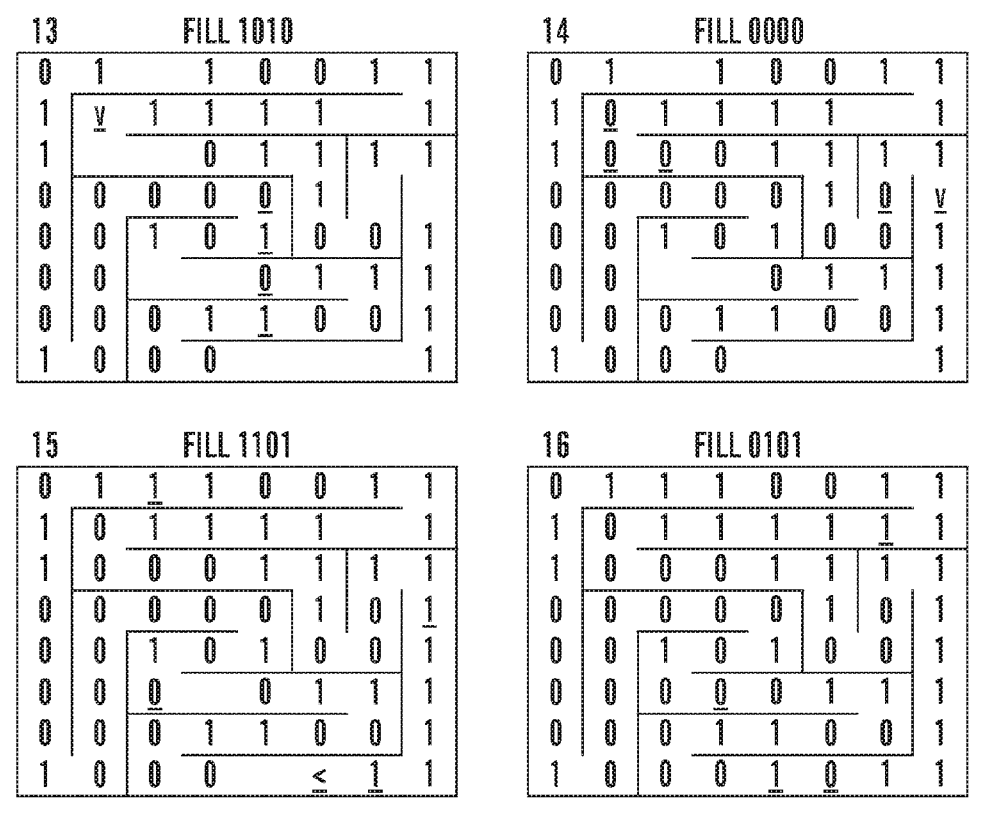

FIGS. 5D, 5E and 5F together show states of an example pad as it is used to code the raw stream to the coded stream of the example of FIGS. 5A, 5B and 5C. Sixteen pad states are shown numbered 1 to 16.

Pad 1 shows the pad state after being filled with "0000". The newly filled values are in bold and underlined. A bold and underlined arrow shows the current position after a next cell has been determined and after determined jumps have been made. In this case no jumps have been made.

Pad 2 shows the pad state after being filled with "0001". One cell has been jumped.

Pad 3 shows the pad state after being filled with "0001". One cell has been jumped.

Pad 4 shows the pad state after being filled with "0110". One cell has been jumped after the first two bits then two cells are jumped after the next two bits. The embodiment uses two bits as an easy way to define when to jump.

Pad 5 shows the pad state after being filled with "1111". Three cells have been jumped after the first two bits and then three cells jumped after the next two bits.

Pad 6 shows the pad state after being filled with "0110". One cell has been jumped after the first two bits and then two cells jumped after the next two bits.

Pad 7 shows the pad state after being filled with "1111". Three cells have been jumped after the first two bits and then three cells jumped after the next two bits.

Pad 8 shows the pad state after being filled with "0001". One cell has been jumped after the last two bits.

Pad 9 shows the pad state after being filled with "0011". Three cells jumped after the last two bits.

Pad 10 shows the pad state after being filled with "1001". Two cells have been jumped after the first two bits and the next idle cell is nice jumps away. The "01" are written into space between the already busy cells but one cell is still jumped after the next two bits have been written.

Pad 11 shows the pad state after being filled with "0111". One cell has been jumped after the first two bits. Then one cell is jumped after the next two bits.

Pad 12 shows the pad state after being filled with "1011". Two cells have been jumped after the first two bits and then three cells jumped after the next two bits.

Pad 13 shows the pad state after being filled with "1010". Two cells have been jumped after the first two bits and then two cells jumped after the next two bits.

Pad 14 shows the pad state after being filled with "0000".

Pad 15 shows the pad state after being filled with "1101".

Pad 16 shows the pad state after being filled with "0101". The pad is full and ready to for serialization into coded stream.

Referring to FIG. 6A another example of not yet encoded raw binary stream is "0000 0001 0001 0110 1111 0110 1111 0001 0011 1001 0111 1011 1010 0000 1101 0101" with corresponding coded binary stream "1010 1000 1110 1010 1100 0110 0100 0101 0100 1111 1000 1000 0010 1111 1011 0110".

Referring to FIG. 6B hexadecimal representation of the raw stream is "0116F6F1397BA0C5" and coded stream of 6A is "A8EAC6454F882FB6".

Referring to FIG. 6C, parameters using in this encoding comprise: initial position (IP)=28; jump(00)=3; jump(01)=4; jump(10)=5; jump(11)=6; matrix width (MW)=8; matrix height (MH)=8; string size (SS)=64; or=−1; and initial path (DP)=A.

Figure 6D:
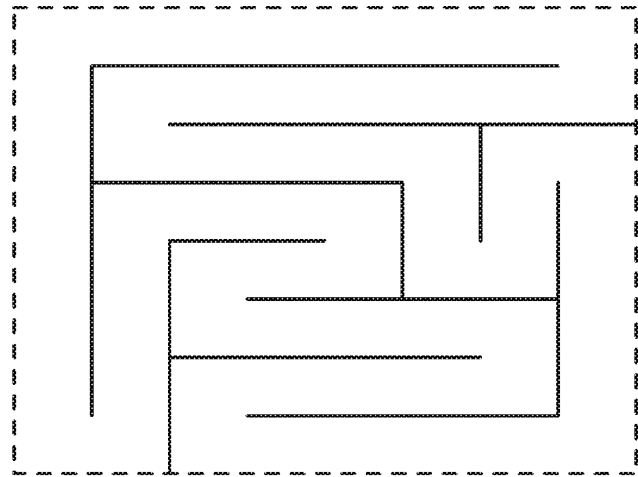
FIG. 6D is a representation of a first path (path A) matrix.

Referring to FIG. 6D a representation of a first path (path A) matrix is shown bordered by a dashed line for easy of differentiation.

Figure 6E:
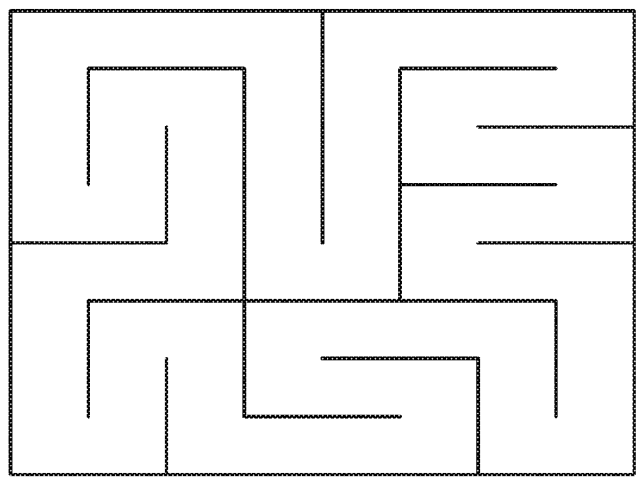
FIG. 6E is a representation of a second path (path B) matrix.

Referring to FIG. 6E a representation of a second path (path B) matrix is shown bordered by a double line for easy of differentiation. This convention is continued in FIGS. 6G, 6H, 6I and 6J.

Referring to FIG. 6F an order of filling is show representing the complex path combination.

Figure 6G:
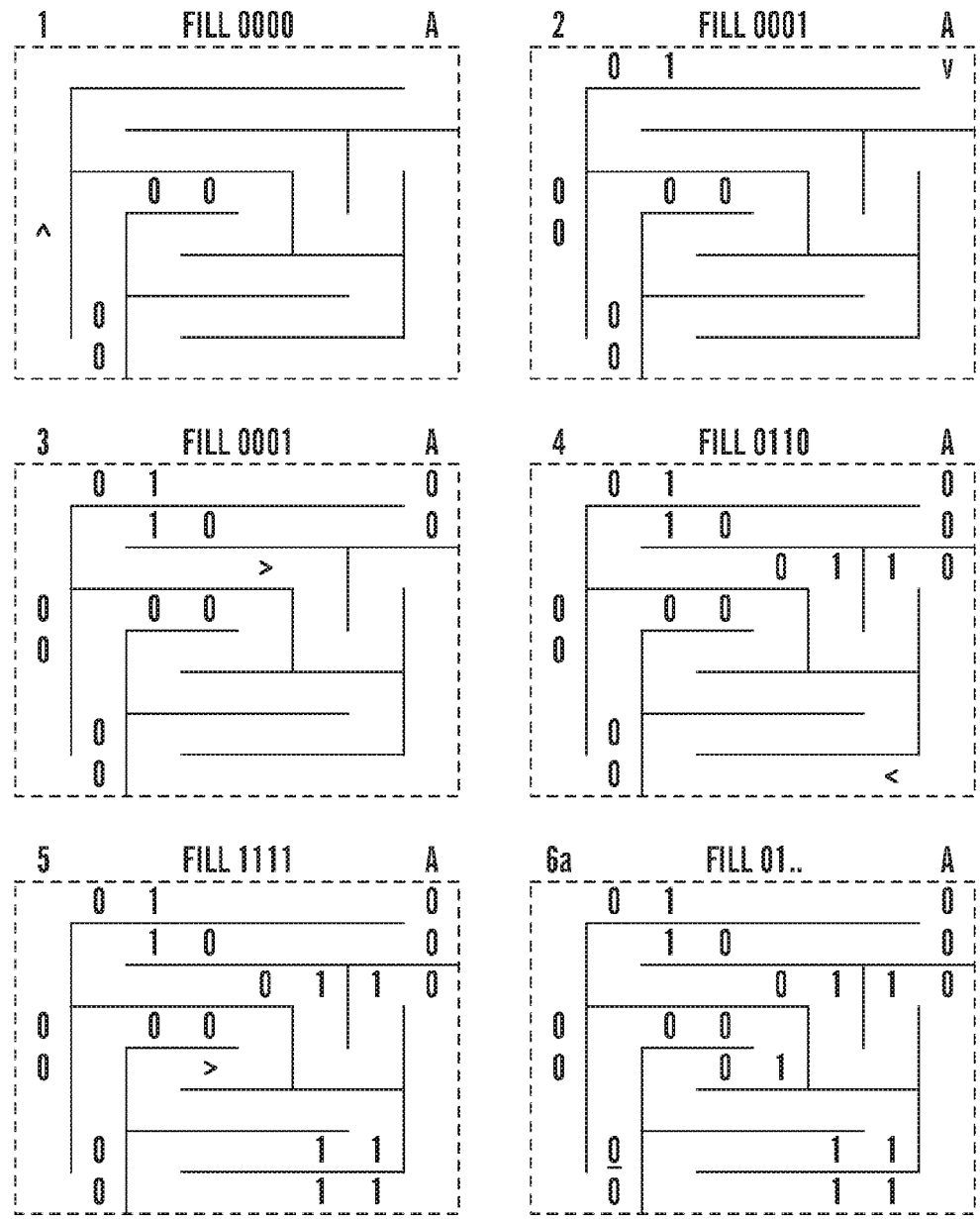

Referring to FIG. 6G pad states 1 to 6a are described.

Pad 1 shows the pad state after being filled with "0000" using complex path A. The newly filled values are in bold. A bold arrow shows the current position after a next cell has been determined and after determined jumps have been made. In this case three jumps are made after each "00".

Pad 2 shows the pad state after being filled with "0001" using path A. The newly filled values are in bold. A jump of three is made after "00" and a jump of four is made after "01".

Pad 3 shows the pad state after being filled with "0001" using path A. A jump of three is made after "00" and a jump of four is made after "01".

Pad 4 shows the pad state after being filled with "0110" using path A. A jump of four is made after "01" and a jump of five is made after "10".

Pad 5 shows the pad state after being filled with "1111" using path A. Two jumps of six are made after each "11".

Pad 6a shows the pad state after being filled with "01 . . . " using path A. A "0" is underlined to indicate where the current cell overlaps a busy cell which is the trigger for switching paths to path B.

Figure 6H:
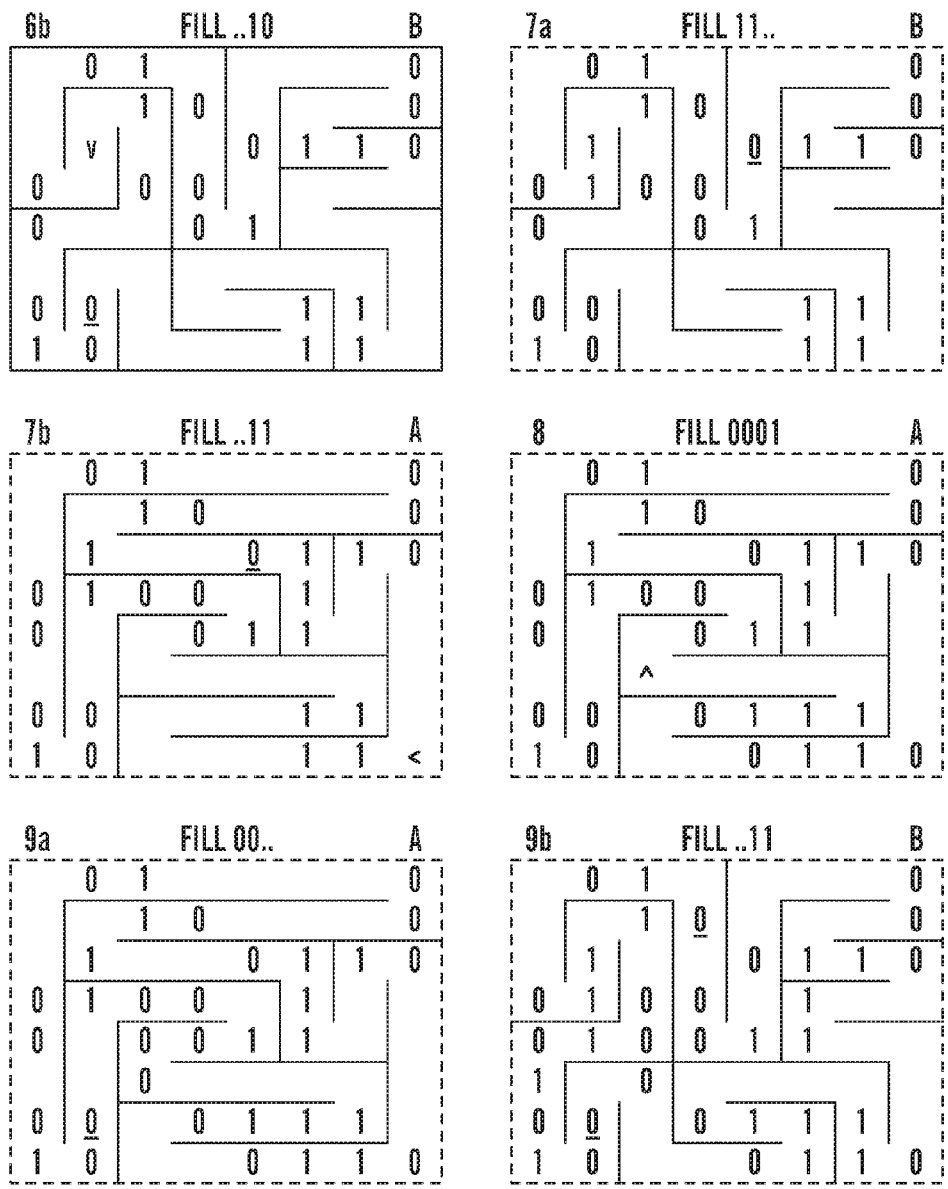

Referring to FIG. 6H, pad states 6b to 9b are described. Pad 6b shows the pad state after being filled with " . . . 10" using path B. A jump of four has been made.

Pad 7a shows the pad state after being filled with "11 . . . " using path B. Six jumps are made. A "0' is underlined to indicate where the current cell overlaps a busy cell which is the trigger for switching paths. The current path is switched to Path A.

Pad 7b shows the pad state after being filled with " . . . 11" using path A. Six jumps are made.

Pad 8 shows the pad state after being filled with "0001" using A. A jump of four is made.

Pad 9a shows the pad state after being filled with "00" using path A. A jump of three is made. A "0' is underlined to indicate where the current cell overlaps a busy cell which is the trigger for switching paths.

Pad 9b shows the pad state after being filled with "11" using path B. A jump of six is made. A further "0' is underlined to indicate where the current cell overlaps a busy cell which is the trigger for switching paths.

Figure 6I:
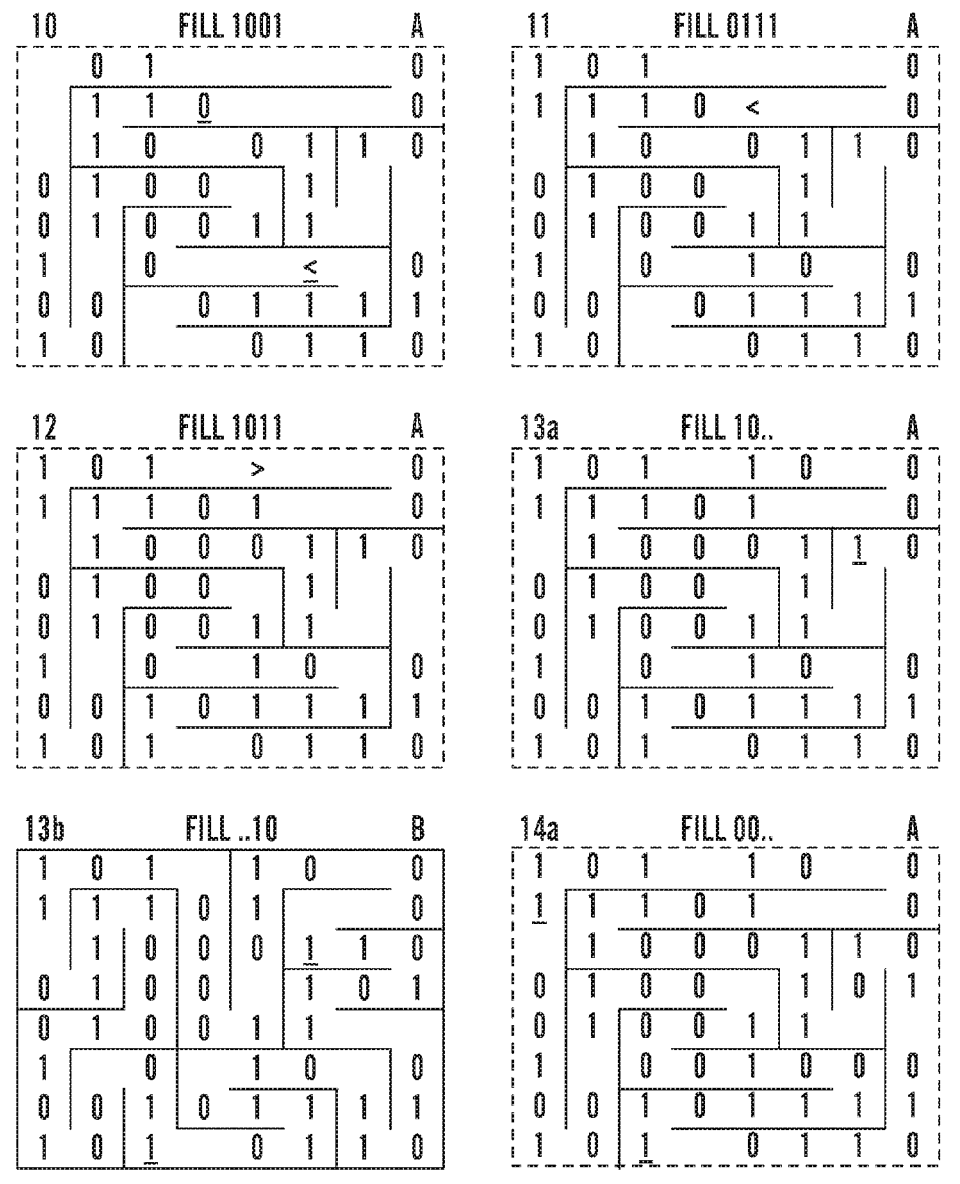

Referring to FIG. 6I, pad states 10 to 14a are described. Pad 10 shows the pad after being filled with "1001" using path A. A jump of five is made and then a jump of four is made.

Pad 11 shows the pad after being filled with "0111" using path A. A jump of four is made and then a jump of six is made.

Pad 12 shows the pad after being filled with "1011" using path A. A jump of five is made and then a jump of six is made.

Pad 13a shows the pad after being filled with "10" using path A. A "0' is underlined to indicate where the current cell overlaps a busy cell which is the trigger for switching paths.

Pad 13b shows the pad after being filled with "10" using path B. A jump of five is made. A "1' is underlined to indicate where the current cell overlaps a busy cell which is the trigger for switching paths.

Pad 14a shows the pad after being filled with "00" using path A. A jump of three is made. A "1' is underlined to indicate where the current cell overlaps a busy cell which is the trigger for switching paths.

Figure 6J:
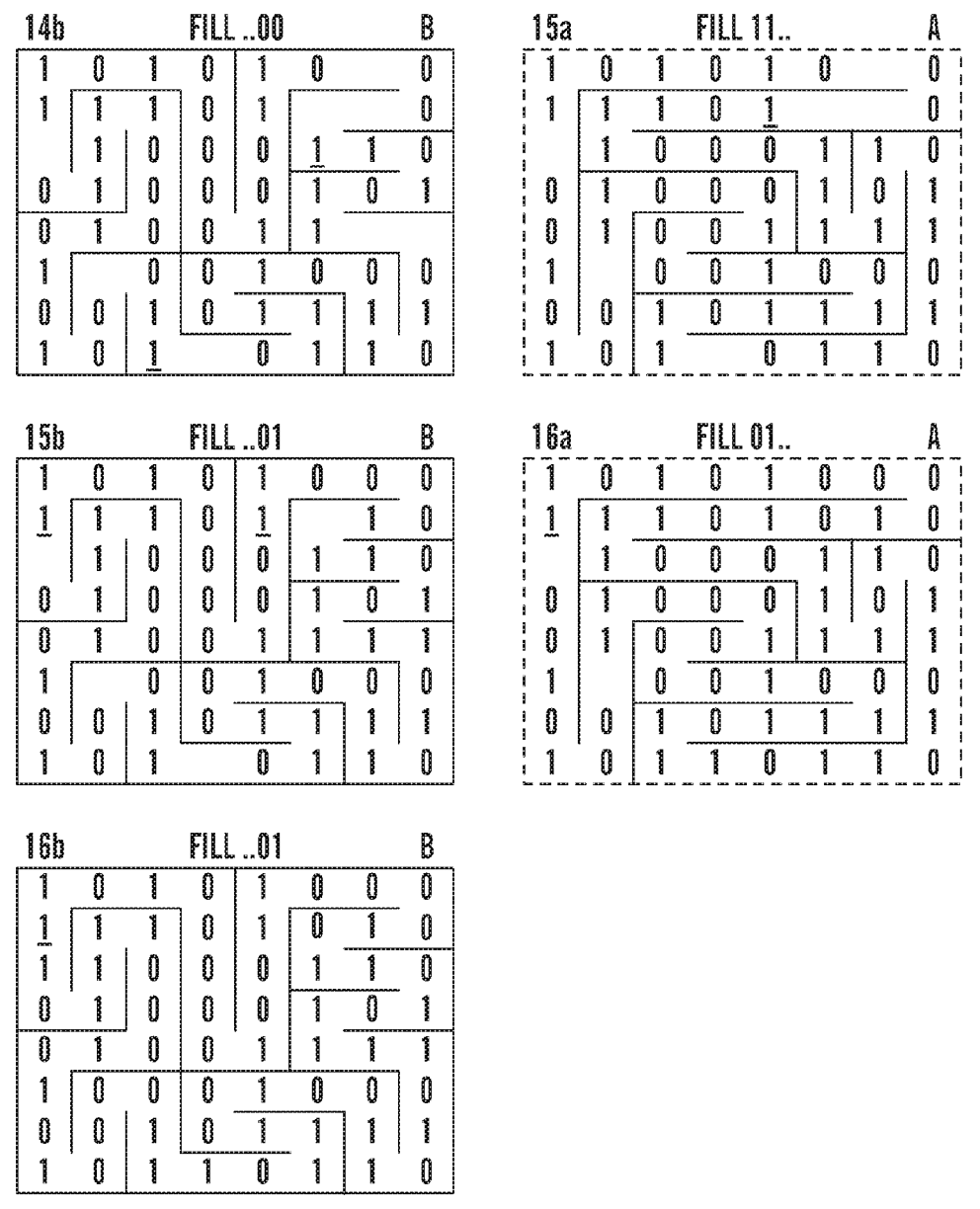

Referring to FIG. 6J, pad states 14b to 16b are described.

Pad 14b shows the pad after being filled with "00" using path B. A jump of three is made. A further "1' is underlined to indicate where the current cell overlaps a busy cell which is the trigger for switching paths.

Pad 15a shows the pad after being filled with "11" using path A. A jump of six is made. A "1' is underlined to indicate where the current cell overlaps a busy cell which is the trigger for switching paths.

Pad 15b shows the pad after being filled with "01" using path B. A further "1' is underlined to indicate where the current cell overlaps a busy cell which is the trigger for switching paths.

Pad 16a shows the pad after being filled with "01" using path A. A "1' is underlined to indicate where the current cell overlaps a busy cell which is the trigger for switching paths.

Pad 16b shows the pad after being filled with "01" using path B. The pad is now full and is serialized to render the coded output string.

Further embodiments of the invention are now described. It will be clear to one of ordinary skill in the art that all or part of the logical process steps of the embodiment may be alternatively embodied in a logic apparatus, or a plurality of logic apparatus, comprising logic elements arranged to perform the logical process steps of the method and that such logic elements may comprise hardware components, firmware components or a combination thereof.

It will be equally clear to one of skill in the art that all or part of the logic components of the embodiment may be alternatively embodied in logic apparatus comprising logic elements to perform the steps of the method, and that such logic elements may comprise components such as logic gates in, for example, a programmable logic array or application-specific integrated circuit. Such a logic arrangement may further be embodied in enabling elements for temporarily or permanently establishing logic structures in such an array or circuit using, for example, a virtual hardware descriptor language, which may be stored and transmitted using fixed or transmittable carrier media.

In a further alternative embodiment, the present invention may be realized in the form of a computer implemented method of deploying a service comprising steps of deploying computer program code operable to, when deployed into a computer infrastructure and executed thereon, cause the computer system to perform all the steps of the method.

It will be appreciated that the method and components of the embodiment may alternatively be embodied fully or partially in a parallel computing system comprising two or more processors for executing parallel software.

A further embodiment of the invention is a computer program product defined in terms of a system and method. The computer program product may include a computer-readable storage medium (or media) having computer-readable program instructions thereon for causing a processor to carry out aspects of the present invention.

The computer-readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (for example, light pulses passing through a fibre-optic cable), or electrical signals transmitted through a wire.

Computer-readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibres, wireless transmission, routers, firewalls, switches, gateway computers and/or edge servers. A network adapter card or network interface in each computing/processing device receives computer-readable program instructions from the network and forwards the computer-readable program instructions for storage in a computer readable storage medium within the respective computing/processing device.

Computer-readable program instructions for carrying out operations of the present invention may be assembler instructions, instruction-set-architecture (ISA) instructions, machine instructions, machine-dependent instructions, microcode, firmware instructions, state-setting data, or either source code or object code written in any combination of one or more programming languages, including an object oriented programming language such as Smalltalk, C++ or the like, and conventional procedural programming languages, such as the C programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the embodiments are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart and/or block diagram block or blocks.

The computer-readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be clear to one skilled in the art that many improvements and modifications can be made to the foregoing exemplary embodiment without departing from the scope of the present invention.

The invention claimed is:

1. A system for encoding an input string of binary characters, comprising:
   a register for cellular data structure definition including a starting empty cell;
   a register for one or more path definitions defining paths through the data structure;
   a character reading and writing engine for writing a binary character to an empty cell with a predefined initial position;
   a next cell determination engine for determining a next empty cell by methodically checking cells along one of the paths in the data structure until an empty cell is located;
   a loop facilitator for looping back to the writing next character step and the determining next cell step until there are no more data characters or a next empty cell is not determined; and
   a serialization deserialization engine for methodically serializing the data structure into a one dimensional binary string of characters representing an encoded string of alphanumeric characters.

2. A system according to claim 1, wherein methodically checking cells along the path comprises traversing cells incrementally from the current cell in a current direction along the path to a new cell and wherein the new cell is the next cell if the new cell is an empty cell otherwise traversing again until an empty cell is located.

3. A system according to claim 1, wherein methodically checking comprises jumping over one or more empty cells depending on conditions.

4. A system according to claim 1, further comprising changing to a new path to locate an empty cell.

5. A system according to claim 1, further comprising changing a current direction if a particular binary character has been written.

6. A system according to claim 5, wherein using a different direction if traversing in the current direction would cross a boundary of the data structure.

7. A system according to claim 6, wherein the current direction changes to an opposite direction if the current direction would cross a boundary of the two dimensional shape.

8. A system of decoding an input string of binary characters representing an encoded string of alphanumeric characters, comprising:
- a register for storing a cellular data structure definition, the cellular data structure definition including a starting current cell;
- a register for storing a data structure definition, the data structure definition for defining one or more paths through the data structure;
- a serialization de-serialization engine for populating the cells with the binary characters using a defined transform so that each populated cell is full;
- character reading and writing engine for reading a binary character from the current cell, writing it to an output string, and setting the current cell to empty;
- a next cell determination engine for determining a next full cell by methodically traversing from the current cell to adjacent cells along the one or more paths in the data structure until a full cell is located; and
- a loop facilitator for looping back to the reading next character step and the determining next cell step until there are no more cells in the data structure or a next full cell is not determined and whereby the output string can be presented as a decoded string of alphanumeric characters.

9. A system according to claim 8, wherein methodically checking cells along the path comprises traversing cells incrementally from the current cell in a current direction along the path to a new cell and wherein the new cell is the next cell if the new cell is an empty cell otherwise traversing again until an empty cell is located.

10. A system according to claim 8, wherein methodically checking comprises jumping over one or more empty cells depending on conditions.

11. A method of encoding an input string of binary characters, comprising:
- defining a cellular data structure including a starting empty cell;
- defining one or more paths through the data structure;
- writing a binary character to an empty cell with a predefined initial position;
- determining a next empty cell by methodically checking cells along one of the paths in the data structure until an empty cell is located;
- looping back to the writing next character step and the determining next cell step until there are no more data characters or a next empty cell is not determined; and
- methodically serializing the data structure into a one dimensional binary string of characters representing an encoded string of alphanumeric characters.

12. A method according to claim 11, wherein methodically checking cells along the path comprises traversing cells incrementally from the current cell in a current direction along the path to a new cell and wherein the new cell is the next cell if the new cell is an empty cell otherwise traversing again until an empty cell is located.

13. A method according to claim 11, wherein methodically checking comprises jumping over one or more empty cells depending on conditions.

14. A method according to claim 11, further comprising changing to a new path to locate an empty cell.

15. A method according to claim 11, further comprising changing a current direction if a particular binary character has been written.

16. A method according to claim 15, wherein using a different direction if traversing in the current direction would cross a boundary of the data structure.

17. A method according to claim 16, wherein the current direction changes to an opposite direction if the current direction would cross a boundary of a two dimensional shape.

18. A method of decoding an input string of binary characters representing an encoded string of alphanumeric characters comprising:
- defining a cellular data structure including a starting current cell;
- defining one or more paths through the data structure;
- populating the cells with the binary characters using a defined transform so that each populated cell is full;
- reading a binary character from the current cell; writing it to an output string, and setting the current cell to empty;
- determining a next full cell by methodically traversing from the current cell to adjacent cells along the one or more paths in the data structure until a full cell is located;
- looping back to the reading next character step and the determining next cell step until there are no more cells in the data structure or a next full cell is not determined; and
- presenting the output string as a decoded string of alphanumeric characters.

19. A computer program product comprising a computer-readable storage medium having computer-readable program code embodied therewith, the computer-readable program code configured to perform a method for encoding an input string of binary characters representing alphanumeric characters when executed by a computer system, the method comprising:
- defining a cellular data structure including a starting empty cell;
- defining one or more paths through the data structure;
- writing a binary character to an empty cell with a predefined initial position;
- determining a next empty cell by methodically checking cells along one of the paths in the data structure until an empty cell is located;
- looping back to the writing next character step and the determining next cell step until there are no more data characters or a next empty cell is not determined; and
- methodically serializing the data structure into a one dimensional binary string of characters representing an encoded string of alphanumeric characters.

* * * * *